(12) United States Patent
Danilov et al.

(10) Patent No.: US 11,347,596 B2
(45) Date of Patent: May 31, 2022

(54) PRELIMINARY DATA PROTECTION USING COMPOSITE COPIES OF DATA IN A DATA STORAGE SYSTEM

(71) Applicant: EMC IP Holding Company LLC, Hopkinton, MA (US)

(72) Inventors: Mikhail Danilov, Saint Petersburg (RU); Konstantin Buinov, Prague (CZ)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 295 days.

(21) Appl. No.: 16/724,803

(22) Filed: Dec. 23, 2019

(65) Prior Publication Data

US 2021/0191818 A1 Jun. 24, 2021

(51) Int. Cl.
*G06F 11/14* (2006.01)
*H03M 13/15* (2006.01)
*G06F 3/06* (2006.01)

(52) U.S. Cl.
CPC .......... *G06F 11/1451* (2013.01); *G06F 3/065* (2013.01); *G06F 3/067* (2013.01); *G06F 3/0619* (2013.01); *G06F 3/0638* (2013.01); *G06F 3/0683* (2013.01); *G06F 11/1448* (2013.01); *H03M 13/154* (2013.01); *G06F 2201/82* (2013.01)

(58) Field of Classification Search
CPC ............. G06F 11/1451; G06F 11/1448; G06F 11/1012; G06F 11/2058; G06F 11/2094; G06F 3/0619; G06F 3/0638; G06F 3/065; G06F 3/067; G06F 3/0683; G06F 2201/82; H03M 13/154; H03M 13/3761
See application file for complete search history.

(56) References Cited

U.S. PATENT DOCUMENTS

| | | | |
|---|---|---|---|
| 2006/0236073 A1* | 10/2006 | Soules ................. | G06F 3/0631 711/216 |
| 2011/0029840 A1* | 2/2011 | Ozzie ................... | H03M 13/05 714/763 |
| 2016/0139980 A1* | 5/2016 | Cowling ............ | G06F 11/1048 714/763 |
| 2019/0050301 A1* | 2/2019 | Juniwal ............... | G06F 11/1438 |
| 2019/0087290 A1* | 3/2019 | Rutman .............. | G06F 11/1092 |
| 2020/0004447 A1* | 1/2020 | Danilov ............... | G06F 3/067 |

* cited by examiner

*Primary Examiner* — Hiep T Nguyen
(74) *Attorney, Agent, or Firm* — Amin, Turocy & Watson, LLP (57) ABSTRACT

The disclosed technology generally describes a preliminary (e.g., triple mirroring) data protection scheme that operates by writing data as redundant (e.g., three) composite copies made up of copies of data fragments to different nodes of a data storage system. The data fragments are distributed such that any two nodes can fail yet a complete set of data remains among the remaining data fragments. Later, erasure encoding creates redundant coding fragments that are written to the nodes of a data storage system in a distributed manner along with one copy of the data fragments, such that any two nodes can fail but the complete data can still be recovered. Redundant data fragments are then deleted.

20 Claims, 10 Drawing Sheets

PRELIMINARY DATA PROTECTION USING COMPOSITE COPIES OF DATA IN A DATA STORAGE SYSTEM

TECHNICAL FIELD

The subject application generally relates to storing data in data storage systems, and more particularly to a preliminary protection technology that uses multiple composite copies of data for improved node failure toleration, and related embodiments.

BACKGROUND

Contemporary cloud-based data storage systems, such as ECS (formerly known as ELASTIC CLOUD STORAGE) provided by DELL EMC, can be based on a cluster of nodes that each owns some part of the stored data (and can store redundant data and/or erasure coded data for data protection purposes) in storage devices. In ECS, disk space is partitioned into a set of blocks referred to as chunks, which for example can be a fixed size of 128 MB. User data objects are stored in chunks, and a data object of typical size ordinarily comprises a set of segments stored to different chunks. The chunks are shared, in that a chunk typically contains segments of multiple, different user objects.

Chunk content is modified in append-only mode. When a chunk becomes full enough, the chunk gets sealed and can no longer be written to with further data. The content of a sealed chunk is immutable.

ECS is a reliable storage, including that erasure coding is used to protect user data at the chunk level. However, chunks are filled with user data at different rates, whereby in general it is difficult to predict the moment when a given chunk will get sealed. During data writes for a client, the data storage system does not send any acknowledgement to the client until the data is properly protected in a non-volatile memory. Therefore, there is a time window between the moment the user data comes into the system and the moment that the chunk gets sealed so that the chunk's content can be encoded.

During this time window, triple mirroring can be used as a preliminary protection scheme before erasure coding occurs; in other words, delayed erasure coding is implemented. Note that with triple mirroring, three mirror copies of a chunk are stored to three different nodes. Therefore, with the basic triple mirroring the system can tolerate dual-node failure.

Triple mirroring results in significant internal data traffic. To reduce the internal data traffic, an optimized triple mirroring preliminary protection scheme was implemented, in which there two complete chunk copies are stored to different nodes, with a third copy comprising a composite copy stored as a set of k data fragments distributed among the nodes; (where k+m refers to erasure coding with k data fragments plus m coding fragments). However, if the two nodes that contain the two complete chunk copies fail, (and at least one of also contained one of the data fragments), the complete set of data is lost. Thus, the data is more vulnerable with this optimized preliminary protection scheme, as this optimized scheme cannot tolerate dual-node failure.

BRIEF DESCRIPTION OF THE DRAWINGS

The technology described herein is illustrated by way of example and not limited in the accompanying figures in which like reference numerals indicate similar elements and in which.

DETAILED DESCRIPTION

Various aspects of the technology described herein are generally directed towards a preliminary protection scheme for data that tolerates dual-node failure by ensuring that no data portion has two copies stored to one node. To perform triple mirroring protection, three composite copies (with k data fragments per composite copy) are written to the nodes such that no data fragment has a duplicate copy on the same node. In other words, for each data fragment, the system chooses three storage blocks that belong to three different nodes. With this preliminary protection scheme, the cluster may lose any two nodes, but there still is a complete set of data fragments stored to the remaining node or nodes.

Once ready to persist the data, such as when the chunk is approximately full or after a predefined time, the system can read any full set of the k data fragments to obtain a complete copy, and perform the encoding erasure coding operation that results in the redundant data (m coding fragments) being generated. These coding fragments are written to selected nodes, based on selecting one main composite chunk copy that determines which nodes contain the coding fragments. Once the coding fragments are written, the other two composite chunk copies can then be deleted.

As will be understood, the implementation(s) described herein are non-limiting examples, and variations to the technology can be implemented. For instance, many of the examples herein are based on ECS, however the technology is applicable to any data storage system that has units of data that need to be protected. As another example, although the term "chunk" is used herein to represent any data storage unit or data portion, the term "chunk" is not limited to ECS chunks, but rather represents any data storage unit, such as corresponding to the fragment level or the stripe level in other storage systems. As such, any of the embodiments, aspects, concepts, structures, functionalities, implementations and/or examples described herein are non-limiting, and the technology may be used in various ways that provide benefits and advantages in data storage in general.

Reference throughout this specification to "one embodiment," "an embodiment," "one implementation," "an implementation," etc. means that a particular feature, structure, or characteristic described in connection with the embodiment/implementation is included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, or characteristics may be combined in any suitable manner in one or more embodiments/implementations.

Aspects of the subject disclosure will now be described more fully hereinafter with reference to the accompanying drawings in which example components and operations are shown. In the following description, for purposes of explanation, numerous specific details are set forth in order to provide a thorough understanding of the various embodiments. However, the subject disclosure may be embodied in many different forms and should not be construed as limited to the examples set forth herein.

Figure 1:
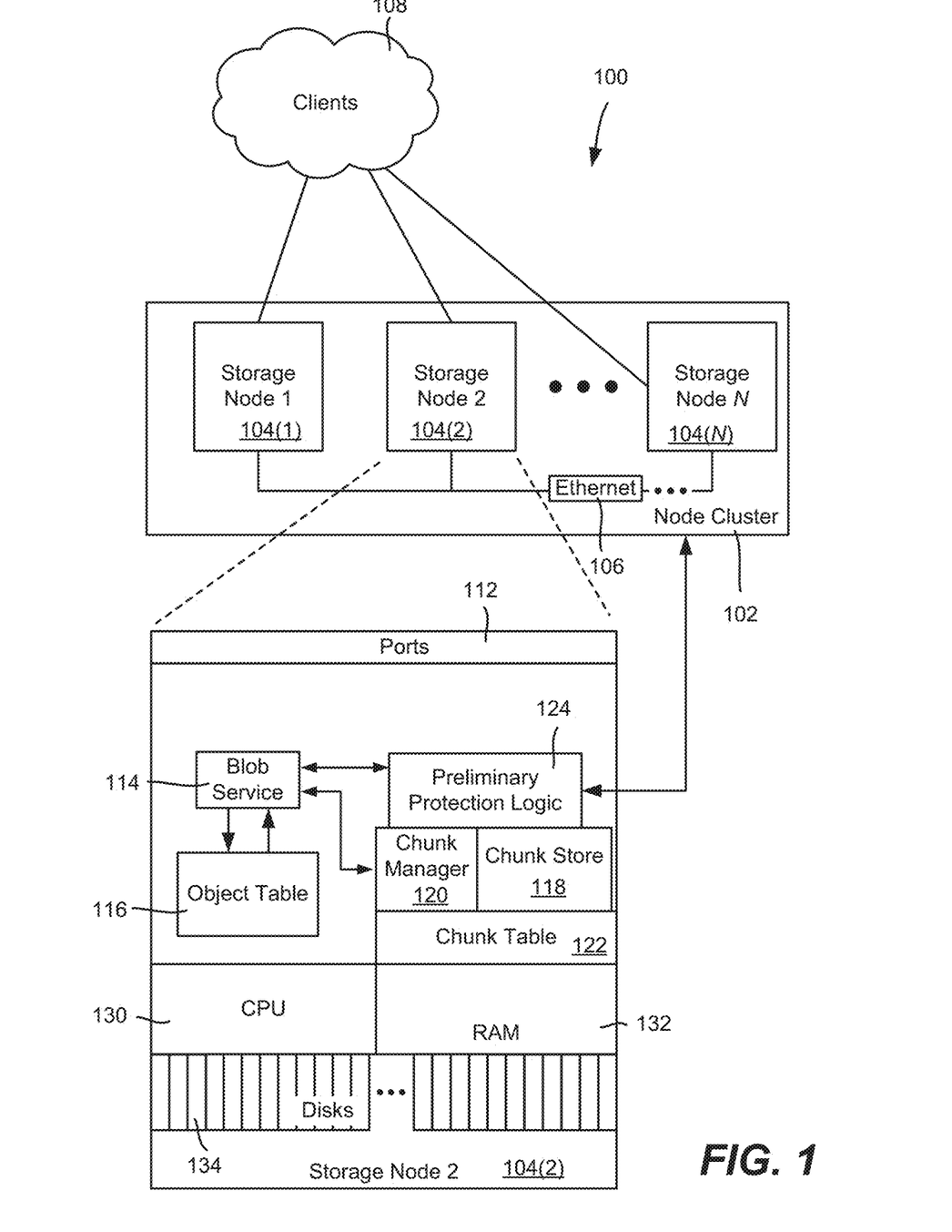
FIG. 1 is an example block diagram representation of part of a data storage system including nodes, in which a preliminary data protection scheme operates by writing multiple composite copies of data fragments to nodes, in accordance with various aspects and implementations of the subject disclosure.

FIG. 1 shows part of a data storage system 100 (such as ECS) comprising a node cluster 102 of storage nodes 104(1)-104(N), in which each node is typically a server configured primarily to serve objects in response to client requests. The nodes 104(1)-104(N) are coupled to each other via a suitable data communications link comprising interfaces and protocols, such as represented in FIG. 1 by Ethernet block 106.

Clients 108 make data system-related requests to the cluster 102, which in general is configured as one large object namespace; there may be on the order of billions of objects maintained in a cluster, for example. To this end, a node such as the node 104(2) (shown enlarged in FIG. 1 as well) generally comprises ports 112 by which clients connect to the cloud storage system. Example ports are provided for requests via various protocols, including but not limited to SMB (server message block), FTP (file transfer protocol), HTTP/HTTPS (hypertext transfer protocol) and NFS (Network File System); further, SSH (secure shell) allows administration-related requests, for example.

Each node, such as the node 104(2), includes an instance of a data storage system; (note however that at least some data service components can be per-cluster, rather than per-node). For example, ECS runs a set of storage services, which together implement storage logic. Services can maintain directory tables for keeping their metadata, which can be implemented as search trees. A blob service 114 maintains an object table 116 (e.g., in various partitions among nodes) that keeps track of objects in the data storage system and generally stores their metadata, including an object's data location information, e.g., within a chunk. There is also a "reverse" directory table (maintained by another service) that keeps a per chunk list of objects that have their data in a particular chunk.

FIG. 1 further represents some additional concepts, in that the user data repository of chunks is maintained in a chunk store 118, managed by another storage service referred to as a chunk manager 120. A chunk table 122 maintains metadata about chunks, e.g., as managed by the chunk manager 120. Chunks of user data are protected by erasure coding, forming protection groups as described herein; (other types of chunks can be protected in other ways, such as by replication).

As described herein, preliminary protection logic 124 operates to distribute data across different nodes of the node cluster 102. To this end, as an object is created, the object data is written to a chunk. The preliminary protection logic 124 creates three composite copies of the chunk, with each composite copy instance comprising k (e.g., twelve) data fragments distributed across different nodes. For example, there is a data fragment copy D1-D12, D1'-D12' and D1"-D12". Note that no node contains the same data fragment copy; the node 104(2) cannot contain D6 and D6' or D6" (or both D6' and D6"), for example, but only up to one of any three data fragment replica copies. Also note that if enough disks are present on a node, the data fragment copies on a given node can be written to different storage devices; e.g., the node 102(1) can maintain data fragment D1 and data fragment D5 on two different disks of the node 102(1), to further provide protection against disk failure. Indeed, the technology described herein increases system tolerance to any kind of hardware failures, e.g. disk failures as well as node failures.

In order for there to be triple mirroring, at least a three-node cluster needs to be operating. Note that it is feasible to provide for other than triple mirroring, e.g., quadruple mirroring can be a desired level of data mirroring, with a redundant number of data fragments written to at least a four-node cluster.

Once the object is written and replicated in the data fragments, additional objects can be written to the same chunk until the chunk is deemed sufficiently full (e.g., contains approximately 128 MB of data or some other threshold percentage thereof) or after a predefined time, typically whichever occurs first. Note that an object that is greater than 128 MB in size can be divided into 128 MB chunks.

At this time, erasure coding is performed to calculates coding (e.g., parity) fragments for the chunk, which are also written to different nodes (and disks thereof) as described herein. This ensures that the fragments within a chunk, including the coding fragments, are written to different nodes/disks to help protect against failure.

Once the coding fragments have been written, the chunk is protected by erasure coding, which provides higher levels of availability than triple mirroring. At this time, two sets of the replica data fragments can be deleted.

In FIG. 1, a CPU 130 and RAM 132 are shown for completeness; note that the RAM 130 may comprise at least some non-volatile RAM. The node 104(2) further includes storage devices such as disks 134, comprising hard disk drives and/or solid-state drives, or any other suitable type of storage resource. As can be readily appreciated, components of the data storage system including those described herein can be at various times in any storage device or devices, such as in the RAM 132, in the disks 134, or in a combination of both, for example.

In general, given k data fragments, during encoding a redundant m coding fragments are created. The way the coding is performed assures that the system can tolerate loss of any m fragments without a data loss event. Lost fragments can be recovered using a decoding operation. In one or more ECS implementations, the default encoding scheme for is 12+4, that is, k equals to 12 and m equals to 4. This 12+4 protection scheme is used in the following examples, in which there are 8 nodes and 16 total fragments to be stored. It is understood, however, that the technology described herein applies for different k+m encoding schemes and different numbers of nodes.

Figure 2:
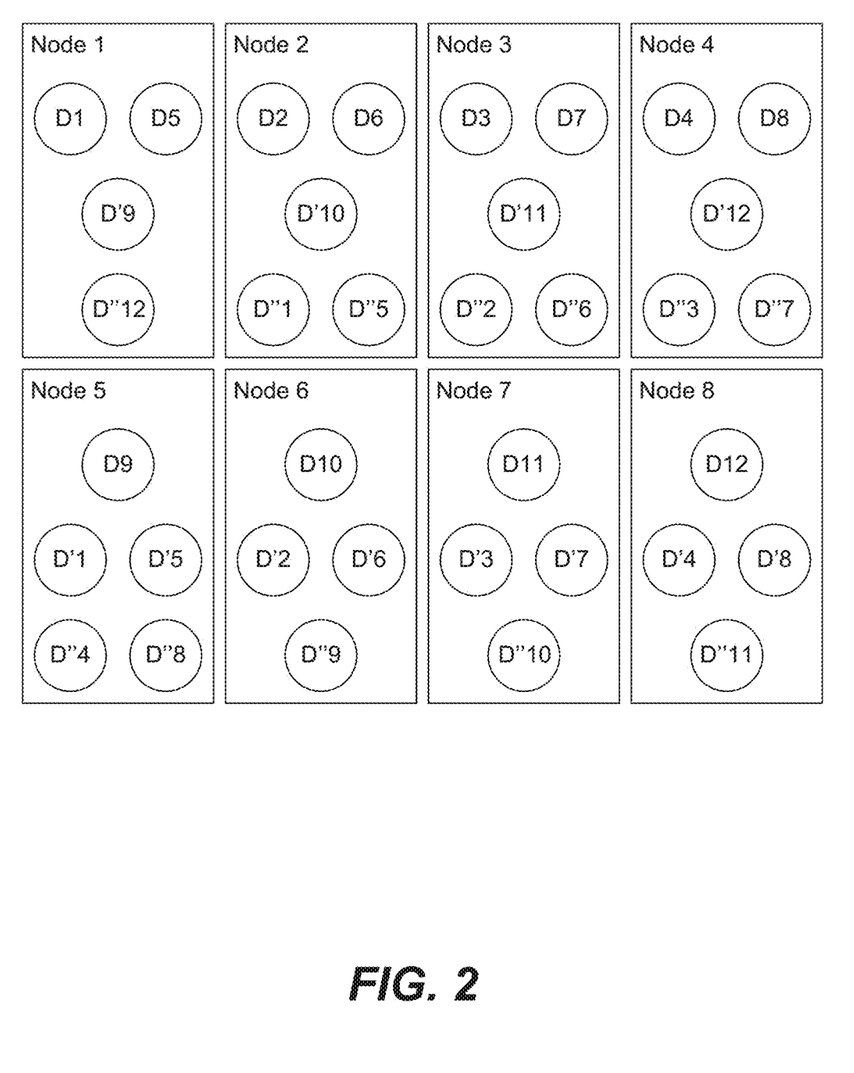
FIG. 2 is an example representation of a cluster of nodes containing data fragment copies distributed among the nodes via preliminary data protection logic, in accordance with various aspects and implementations of the subject disclosure.

FIG. 2 shows on possible layout of data fragments to illustrate the concept of replicated data fragments. Some data portion (D) being replicated, such as a partially filled chunk, is divided into k data fragments (Di); in this example k equals 12. There are three composite copies shown in FIG. 2, namely D1-D12, D1'-D12' and D1"-D12".

To this end, the data storage system 100 (e.g., the preliminary protection logic 124 of FIG. 1) allocates three (for triple mirroring) independent sets of storage capacity blocks; each set comprises k blocks. For example, a suitable size of each storage capacity block is the size of a data fragment, which can be the chunk size/k.

The preliminary protection logic 124 fills the three composite chunks with data, starting with the first data fragment and filling the data fragments one-by-one. For each next data fragment, the preliminary protection logic 124 chooses three storage capacity blocks from the three independent sets such that no two storage capacity blocks belong to one node. That is, for each data fragment the system chooses three storage capacity blocks that belong to three different nodes. With the triple data fragment replica protection scheme described herein, each data fragment has three copies (mirror copy, mirror copy', and mirror copy") stored to three different nodes.

Thus, as can be seen in the example layout of FIG. 2, no data segment replica copy is on the same node; for example the data segments D1, D1' and D1" are on three different nodes, namely Node 1, Node 5 and Node 2, respectively. The same is true for any other data segment replicated copies.

Note that the three chunk copies are composite, unlike a mix between two complete chunk copies and composite chunk copy. In the mixed scenario, it is possible that a complete chunk copy is stored together with a part (a data fragment) of a composite chunk copy. If such a node failed in a dual-node failure situation, in which the other node that failed was the one that contained the other complete chunk copy, a data loss event occurred because no complete copy remains. In contrast, a dual-node failure with the three composite chunk copies as described herein does not result in a data loss event.

Figure 3:
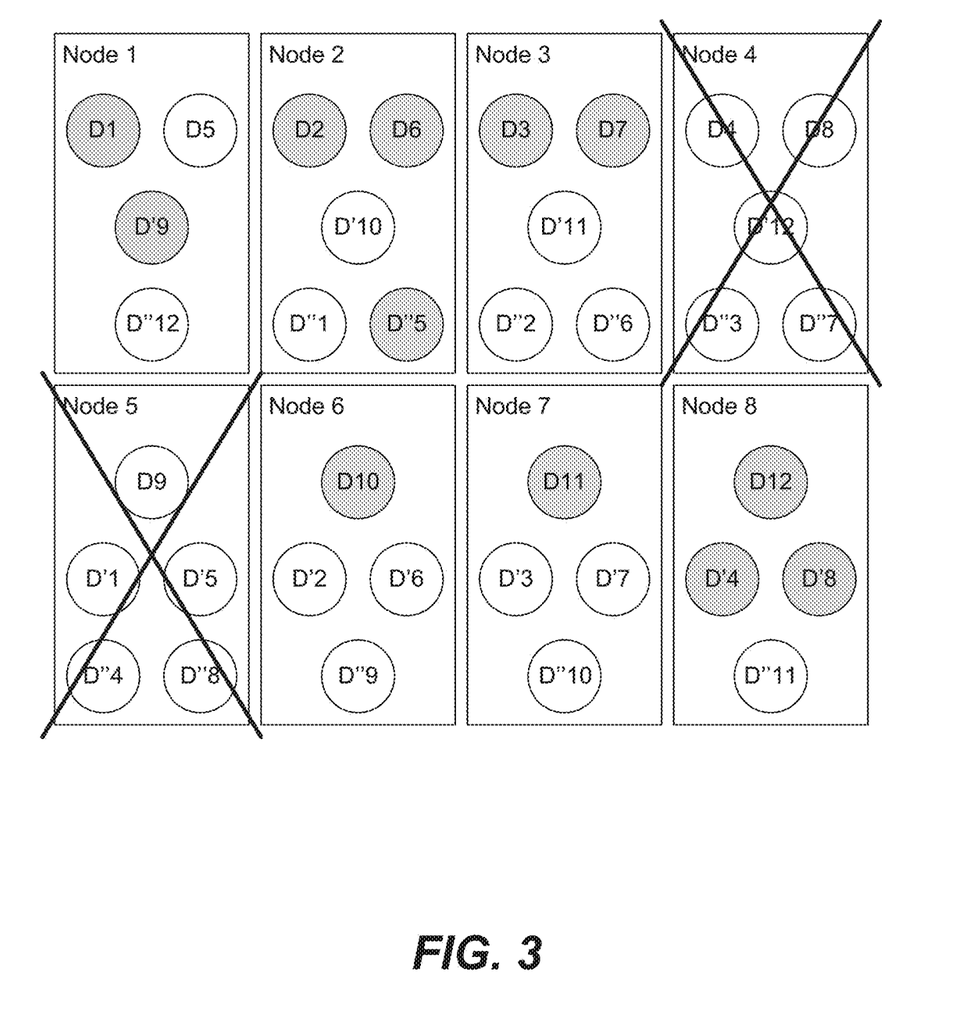
FIG. 3 is an example representation of the cluster of FIG. 2, in which two nodes have failed while the data fragment copies among the remaining nodes contain a complete set of data, in accordance with various aspects and implementations of the subject disclosure.

More particularly, as shown in FIG. 3, if a cluster loses any two nodes (shown as crossed out nodes 4 and 5 in FIG. 3), there still remains available a complete set of data fragments (those shown as shaded) stored to the remaining nodes 1-3 and 6-8. Although the system has lost two nodes, nodes 4 and 5 in the example of FIG. 3, it is understood that the technology described herein applies to any two nodes. That is, regardless of which two nodes are lost, there remains a complete set of data fragments stored to the remaining nodes. Note that the data fragments that form a complete set normally belong to different composite chunk copies. In the example of FIG. 3, they belong to all three chunk copies. This is true for even a three-node system, as each node of a three-node system contains a complete copy of the data fragments; (note that a three-node system can simply keep three mirror copies of the data instead of fragmentizing, however fragmentizing the data as described herein still works).

Figure 4:
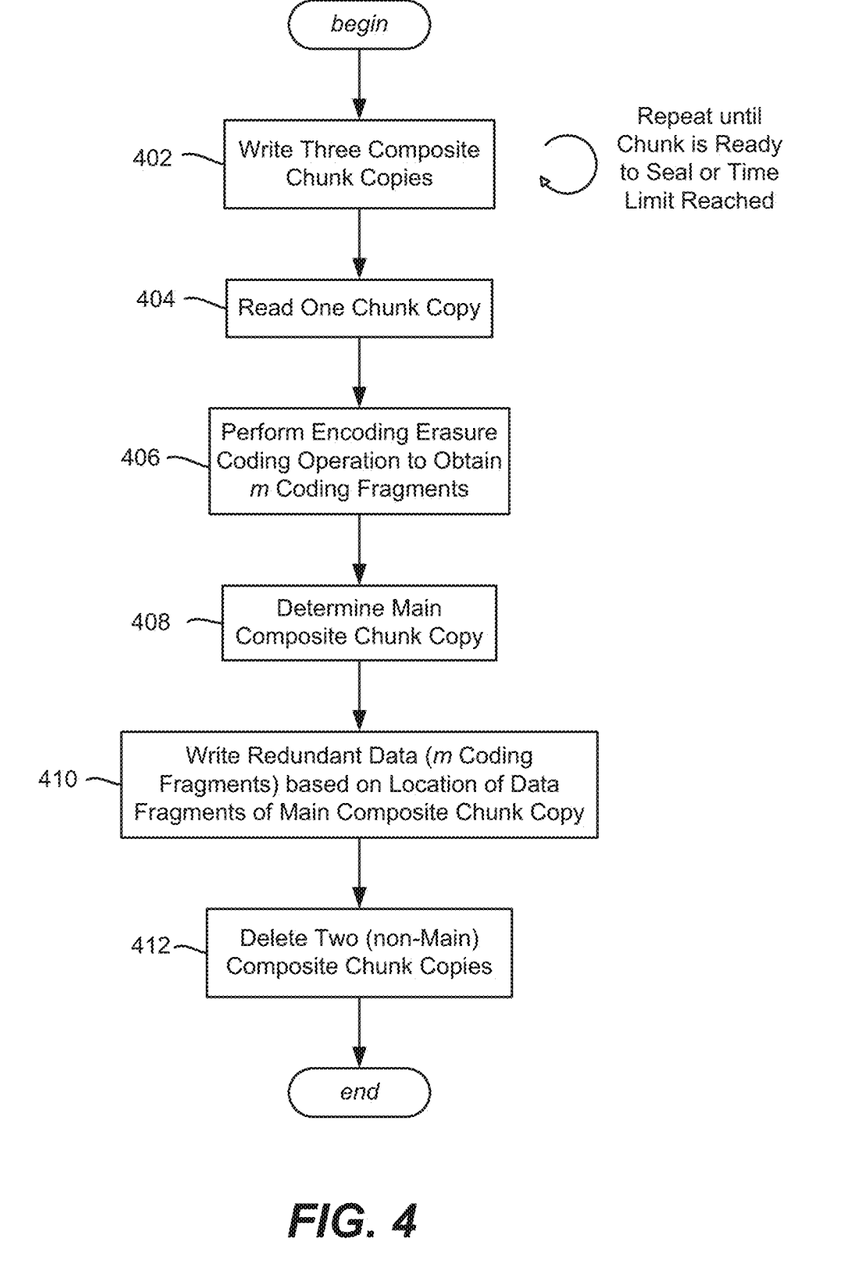
FIG. 4 is a flow diagram representation of example operations related to a triple mirroring preliminary data protection scheme, in accordance with various aspects and implementations of the subject disclosure

FIG. 4 shows example operations of the preliminary protection logic 124, beginning at operation 402 where the three composite chunk copies are written as described herein, e.g., with each data fragment replica copy being written to three different nodes, such as in the example layout of FIG. 2. The process repeats until some event causes the chunk to be sealed and erasure coding protection to commence, which, for example, could be when the chunk reaches a threshold usage capacity, after some expiration time is reached, if node failure occurs, or the like.

When erasure coding is to be performed, operation 404 reads one full chunk copy, e.g., from any twelve different data fragments, (which can be the same composite copy if no nodes/disks failed, or can be a mix from different composite copies if needed). Operation 406 performs the erasure coding on the chunk copy to obtain the m coding fragments, (e.g., m is 4 by default in one or more implementations).

Operation 408 determines a main composite chunk copy. More particularly, the three copies of the chunk contain the same data, but are not equal with respect to which ones remain with respect to where the coding fragments are to be written. To this end, the data storage system (e.g., the preliminary protection logic 124) chooses a main copy to know where to store the coding fragments produced during encoding so that the data and coding fragments are properly distributed with respect to erasure coding protection. Note that if needed because of node failures, one or more data fragments can be moved for this purpose.

Figure 5:
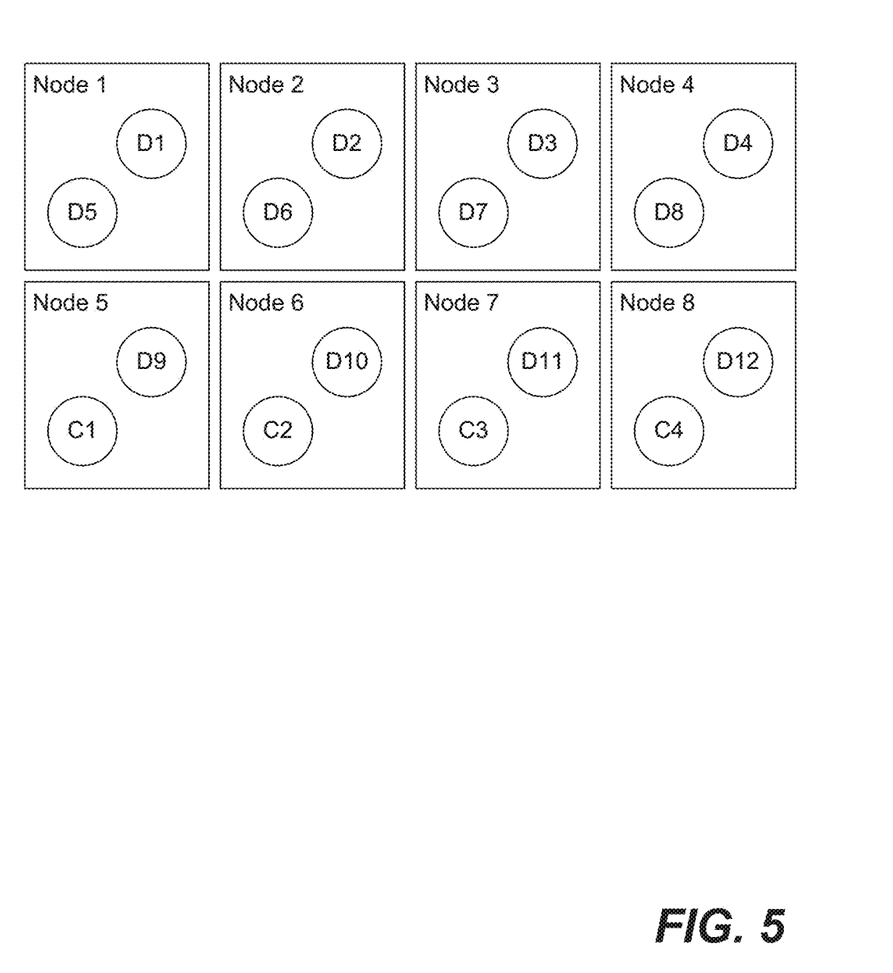
FIG. 5 is an example representation of a cluster of nodes containing one copy of data fragments and coding fragments distributed among the nodes after the example operations of FIG. 4 are performed, in accordance with various aspects and implementations of the subject disclosure.

In the non-failure example of FIG. 2, consider that the first mirror copy (Di without a prime (') or double prime (")) is selected as the main copy at operation 408. Therefore, so that at least eight total fragments remain for recovery if any two nodes fail, the coding fragments C1-C4 are stored to nodes 5, 6, 7, and 8, respectively, as shown in FIG. 5. As is understood, the ordering of the redundant coding fragments does not matter, only the distribution of the four coding fragments to the nodes 5, 6, 7, and 8 in this example.

FIG. 5 also shows that after the coding fragments have been stored, the other two (the non-mail copy) composite chunk copies are deleted. This corresponds to operation 412 of FIG. 4.

It should be noted that composite chunk copies cause a greater system metadata footprint. However, the technology described herein is a preliminary protection scheme, and after redundant chunk copies have been removed, the additional system metadata is gone. Thus, the new optimized preliminary protection scheme introduces no long-lasting negative effects.

Figure 6:
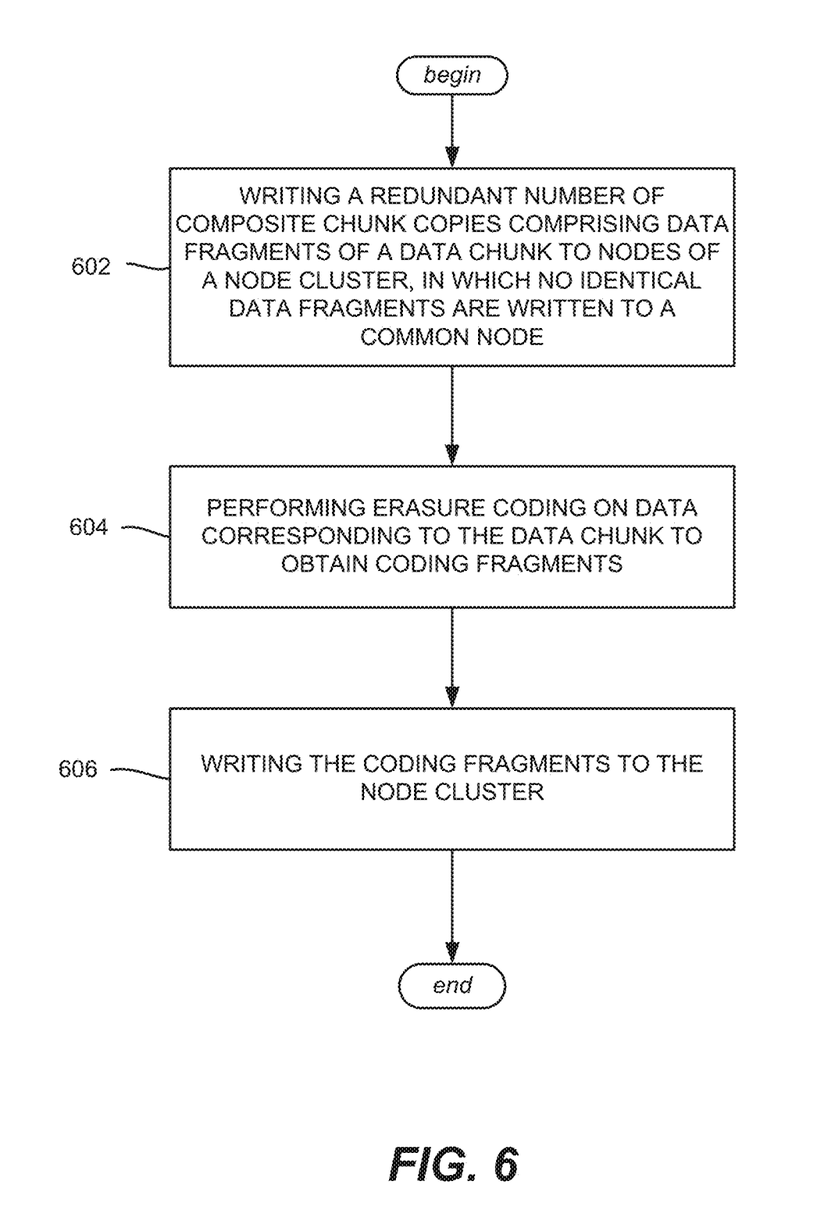
FIG. 6 is a flow diagram representation of example operations related to writing redundant composite chunk copies comprising data fragments to nodes of a node cluster as part of a preliminary data protection scheme, in accordance with various aspects and implementations of the subject disclosure.

One or more aspects are represented in FIG. 6, and for example can be a system, comprising a processor, and a memory that stores executable instructions that, when executed by the processor, facilitate performance of operations. Example operations can comprise operation 602, which represents writing a redundant number of composite chunk copies comprising data fragments of a data chunk to nodes of a node cluster, in which no identical data fragments are written to a common node; Example operation 604 represents performing erasure coding on data corresponding to the data chunk to obtain coding fragments Example operation 606 represents writing the coding fragments to the node cluster.

Writing the coding fragments to the storage devices of the node cluster can comprise distributing the coding fragments to avoid having two coding fragments written to a same node.

Further operations can comprise deleting one less than the redundant number of composite chunk copies to leave a single composite chunk copy having the data fragments distributed among the nodes.

Further operations can comprise selecting the redundant number based on a desired level of data mirroring.

The redundant number of the composite chunk copies can equal three.

Further operations can comprise deleting two composite chunk copies to leave one composite chunk copy comprising the data fragments distributed among the nodes.

Further operations can comprise processing the data chunk into a composite chunk comprising the data fragments.

Further operations can comprise allocating blocks on the nodes for the data fragments, and wherein the writing the redundant number of composite chunk copies comprises, selecting, for a data fragment, the redundant number of blocks allocated on different nodes as selected blocks for the data fragment, and storing a copy of the data fragment to the selected blocks.

Further operations can comprise persisting the data fragments and the coding fragments to non-volatile storage.

The redundant number of the composite chunk copies can equal three, and the writing the coding fragments to the node cluster can comprise selecting the data fragments of one composite chunk copy as a main copy of the data fragments, determining a group of nodes that comprise less than two of the data fragments of the main copy, and storing respective ones of the coding fragments to respective nodes of the group of nodes.

In one implementation, the node cluster can comprise at least eight nodes.

Figure 7:
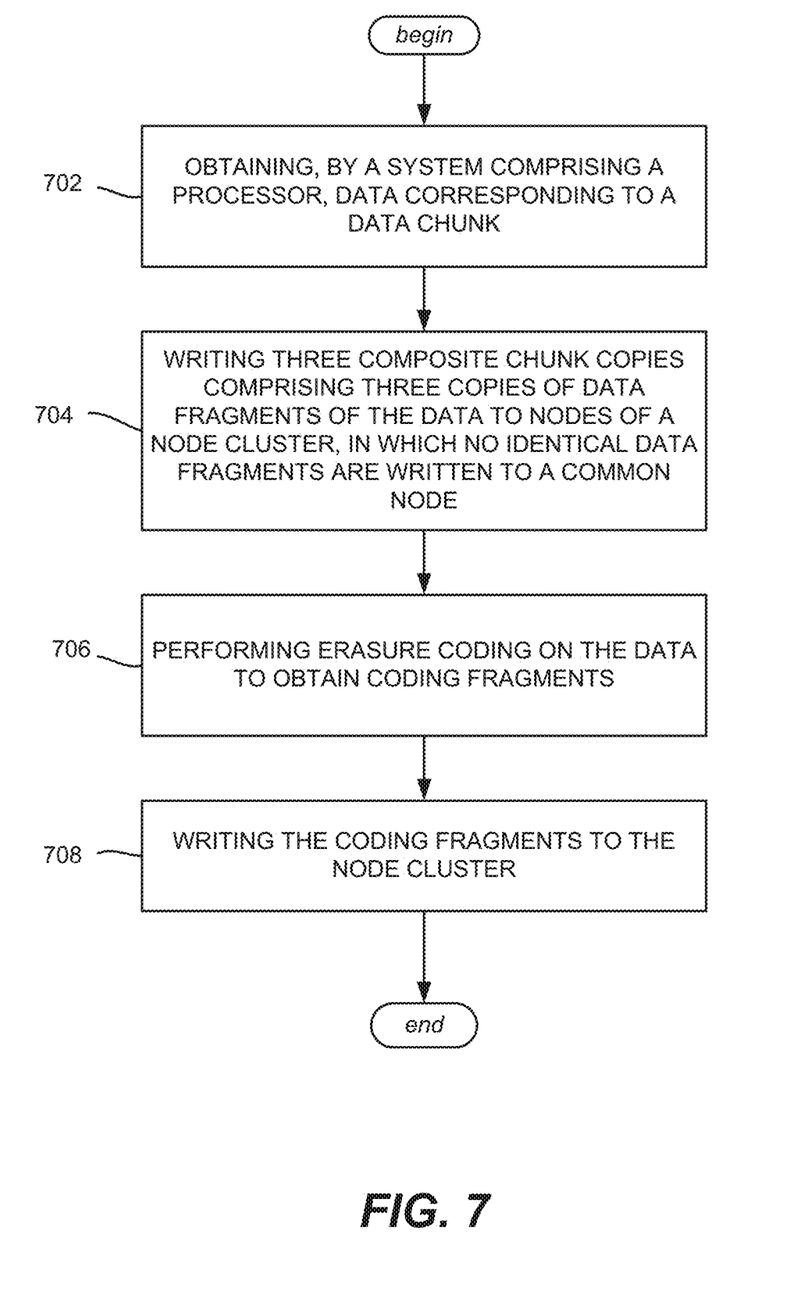
FIG. 7 is a flow diagram representation of example operations related to writing data fragments among nodes as part of a preliminary data protection scheme, in which no identical data fragments are written to a common node, in accordance with various aspects and implementations of the subject disclosure.

One or more example aspects are represented in FIG. 7, and can correspond to operations of a method, for example. Example operations comprise operation 702, which represents obtaining, by a system comprising a processor, data corresponding to a data chunk. Operation 704 represents writing three composite chunk copies comprising three copies of the data fragments to nodes of a node cluster, in which no identical data fragments are written to a common node. Operation 706 represents performing erasure coding on the data to obtain coding fragments. Operation 708 represents writing the coding fragments to the node cluster.

Writing the coding fragments to the storage devices of the node cluster can comprise distributing the coding fragments to avoid having two coding fragments maintained on a same node.

Writing the three composite chunk copies can comprise allocating blocks on the nodes for the copies of the data fragments, selecting, for a selected data fragment, three blocks allocated on different nodes as three selected blocks for the data fragment, and storing three copies of the selected data fragment to the three selected blocks.

Writing the coding fragments to the node cluster can comprise selecting the data fragments of one composite chunk copy as a main copy of the data fragments, determining a group of nodes that comprise only one data fragment of the main copy, and storing the coding fragments distributed among the group of nodes.

Aspects can comprise persisting one of the composite copies and the coding fragments to non-volatile storage.

Aspects can comprise deleting two composite chunk copies to leave a single composite chunk copy having the data fragments distributed among the nodes.

Figure 8:
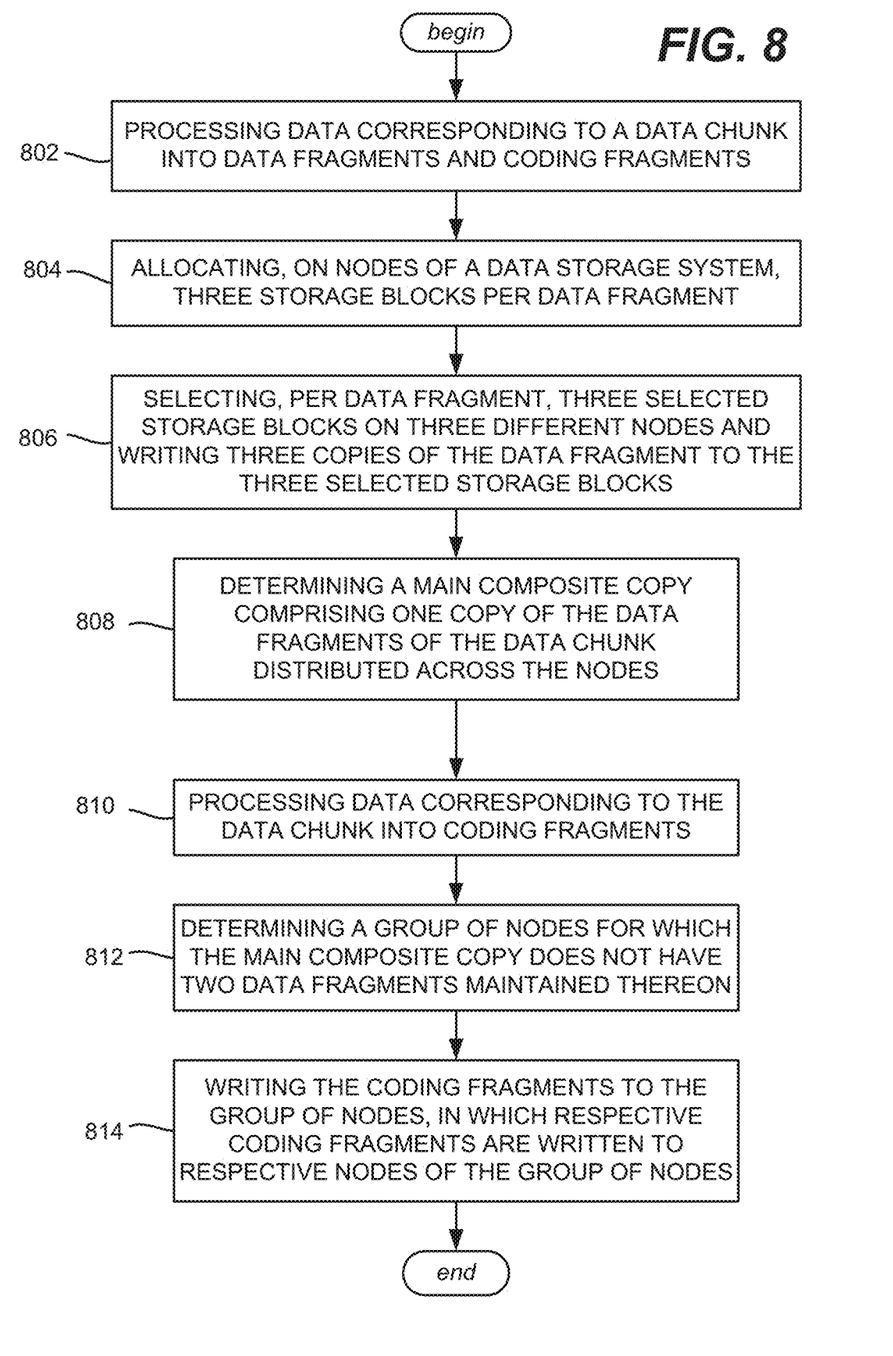
FIG. 8 is a flow diagram representation of example operations related to allocating storage blocks among different nodes and writing respective data fragment copies to the storage blocks as part of a preliminary data protection scheme, in accordance with various aspects and implementations of the subject disclosure

One or more aspects, such as implemented in a machine-readable storage medium, comprising executable instructions that, when executed by a processor, facilitate performance of operations, can be directed towards operations exemplified in FIG. 8. Operation 802 represents processing data corresponding to a data chunk into data fragments. Operation 804 represents allocating, on nodes of a data storage system, three storage blocks per data fragment. Operation 806 represents selecting, per data fragment, three selected storage blocks on three different nodes and writing three copies of the data fragment to the three selected storage blocks. Operation 808 represents determining a main composite copy comprising one copy of the data fragments of the data chunk distributed across the nodes. Operation 810 represents processing data corresponding to the data chunk into coding fragments. Operation 812 represents determining a group of nodes for which the main composite copy does not have two data fragments maintained thereon. Operation 814 represents writing the coding fragments to the group of nodes, in which respective coding fragments are written to respective nodes of the group of nodes Further operations can comprise deleting two composite chunk copies to leave a single composite chunk copy having the data fragments distributed among the nodes.

Further operations can comprise persisting the main composite copy and the coding fragments to non-volatile storage.

As can be seen, described herein is a technology that facilitates a safer preliminary protection scheme. The technology reduces data traffic within a storage system but does not compromise on data availability. With the preliminary protection technology described herein, even as small as a three-node storage cluster may tolerate a dual-node failure without data loss.

Figure 9:
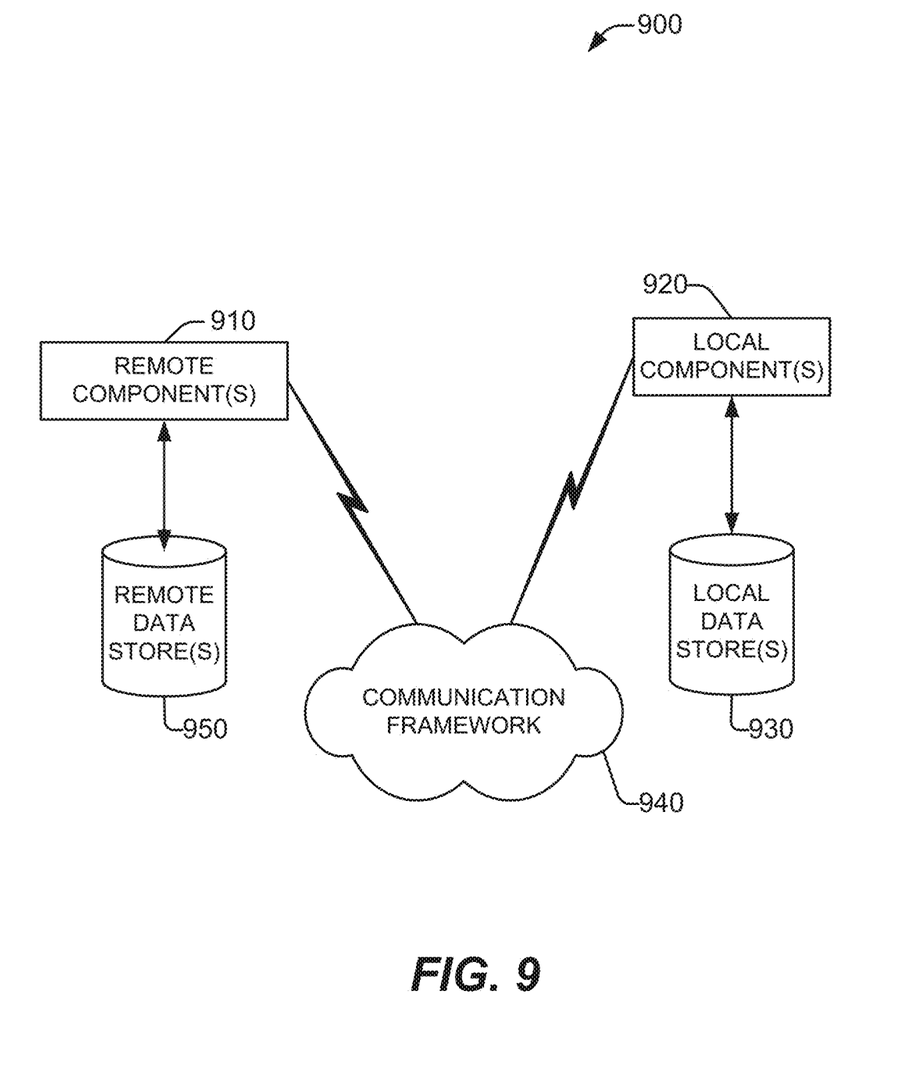
FIG. 9 depicts an example schematic block diagram of a computing environment with which the disclosed subject matter can interact, in accordance with various aspects and implementations of the subject disclosure.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a distributed computer system, connected to a local automatic scaling component and/or programs that use the resources of a distributed computer system, via communication framework 940. Communication framework 940 can comprise wired network devices, wireless network devices, mobile devices, wearable devices, radio access network devices, gateway devices, femtocell devices, servers, etc.

The system 900 also comprises one or more local component(s) 920. The local component(s) 920 can be hardware and/or software (e.g., threads, processes, computing devices). In some embodiments, local component(s) 920 can comprise an automatic scaling component and/or programs that communicate/use the remote resources 910 and 920, etc., connected to a remotely located distributed computing system via communication framework 940.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940.

Figure 10:
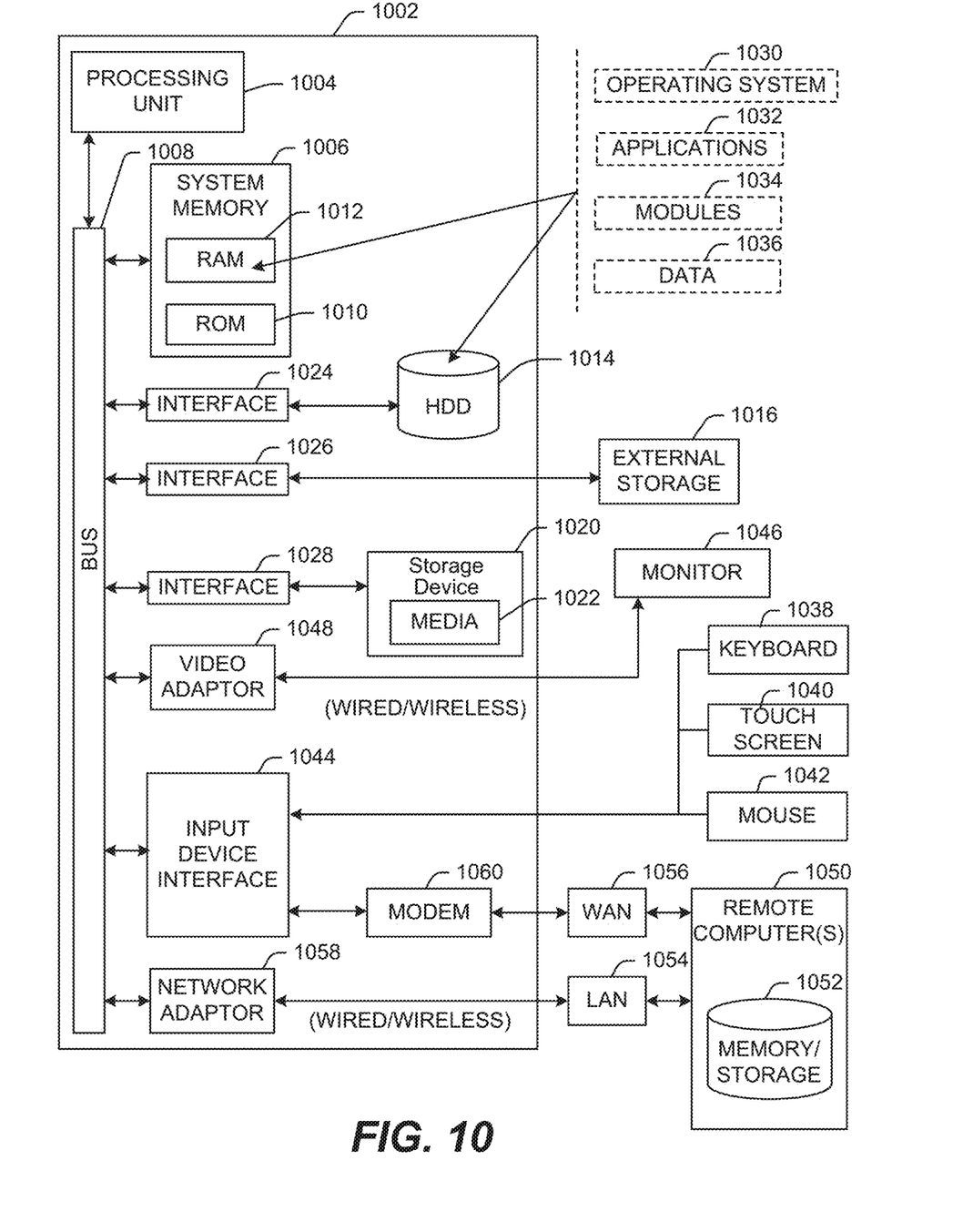
FIG. 10 illustrates an example block diagram of a computing system operable to execute the disclosed systems and methods in accordance with various aspects and implementations of the subject disclosure.

In order to provide additional context for various embodiments described herein, FIG. 10 and the following discussion are intended to provide a brief, general description of a suitable computing environment 1000 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 10, the example environment 1000 for implementing various embodiments of the aspects described herein includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes ROM 1010 and RAM 1012. A basic input/output system (BIOS) can be stored in a non-volatile memory such as ROM, erasable programmable read only memory (EPROM), EEPROM, which BIOS contains the basic routines that help to transfer information between elements within the computer 1002, such as during startup. The RAM 1012 can also include a high-speed RAM such as static RAM for caching data.

The computer 1002 further includes an internal hard disk drive (HDD) 1014 (e.g., EIDE, SATA), and can include one or more external storage devices 1016 (e.g., a magnetic floppy disk drive (FDD) 1016, a memory stick or flash drive reader, a memory card reader, etc.). While the internal HDD 1014 is illustrated as located within the computer 1002, the internal HDD 1014 can also be configured for external use in a suitable chassis (not shown). Additionally, while not shown in environment 1000, a solid state drive (SSD) could be used in addition to, or in place of, an HDD 1014.

Other internal or external storage can include at least one other storage device 1020 with storage media 1022 (e.g., a solid state storage device, a nonvolatile memory device, and/or an optical disk drive that can read or write from removable media such as a CD-ROM disc, a DVD, a BD, etc.). The external storage 1016 can be facilitated by a network virtual machine. The HDD 1014, external storage device(s) 1016 and storage device (e.g., drive) 1020 can be connected to the system bus 1008 by an HDD interface 1024, an external storage interface 1026 and a drive interface 1028, respectively.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. The systems and methods described herein can be implemented utilizing various commercially available operating systems or combinations of operating systems.

Computer 1002 can optionally comprise emulation technologies. For example, a hypervisor (not shown) or other intermediary can emulate a hardware environment for operating system 1030, and the emulated hardware can optionally be different from the hardware illustrated in FIG. 10. In such an embodiment, operating system 1030 can comprise one virtual machine (VM) of multiple VMs hosted at computer 1002. Furthermore, operating system 1030 can provide runtime environments, such as the Java runtime environment or the .NET framework, for applications 1032. Runtime environments are consistent execution environments that allow applications 1032 to run on any operating system that includes the runtime environment. Similarly, operating system 1030 can support containers, and applications 1032 can be in the form of containers, which are lightweight, standalone, executable packages of software that include, e.g., code, runtime, system tools, system libraries and settings for an application.

Further, computer 1002 can be enable with a security module, such as a trusted processing module (TPM). For instance with a TPM, boot components hash next in time boot components, and wait for a match of results to secured values, before loading a next boot component. This process can take place at any layer in the code execution stack of computer 1002, e.g., applied at the application execution level or at the operating system (OS) kernel level, thereby enabling security at any level of code execution.

A user can enter commands and information into the computer 1002 through one or more wired/wireless input devices, e.g., a keyboard 1038, a touch screen 1040, and a pointing device, such as a mouse 1042. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1004 through an input device interface 1044 that can be coupled to the system bus 1008, but can be connected by other interfaces, such as a parallel port, an IEEE 1394 serial port, a game port, a USB port, an IR interface, a BLUETOOTH® interface, etc.

A monitor 1046 or other type of display device can be also connected to the system bus 1008 via an interface, such as a video adapter 1048. In addition to the monitor 1046, a computer typically includes other peripheral output devices (not shown), such as speakers, printers, etc.

The computer 1002 can operate in a networked environment using logical connections via wired and/or wireless communications to one or more remote computers, such as a remote computer(s) 1050. The remote computer(s) 1050 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1052 is illustrated. The logical connections depicted include wired/wireless connectivity to a local area network (LAN) 1054 and/or larger networks, e.g., a wide area network (WAN) 1056. Such LAN and WAN networking environments are commonplace in offices and companies, and facilitate enterprise-wide computer networks, such as intranets, all of which can connect to a global communications network, e.g., the Internet.

When used in a LAN networking environment, the computer 1002 can be connected to the local network 1054 through a wired and/or wireless communication network interface or adapter 1058. The adapter 1058 can facilitate wired or wireless communication to the LAN 1054, which can also include a wireless access point (AP) disposed thereon for communicating with the adapter 1058 in a wireless mode.

When used in a WAN networking environment, the computer 1002 can include a modem 1060 or can be connected to a communications server on the WAN 1056 via other means for establishing communications over the WAN 1056, such as by way of the Internet. The modem 1060, which can be internal or external and a wired or wireless device, can be connected to the system bus 1008 via the input device interface 1044. In a networked environment, program modules depicted relative to the computer 1002 or portions thereof, can be stored in the remote memory/storage device 1052. It will be appreciated that the network connections shown are example and other means of establishing a communications link between the computers can be used.

When used in either a LAN or WAN networking environment, the computer 1002 can access cloud storage systems or other network-based storage systems in addition to, or in place of, external storage devices 1016 as described above. Generally, a connection between the computer 1002 and a cloud storage system can be established over a LAN 1054 or WAN 1056 e.g., by the adapter 1058 or modem 1060, respectively. Upon connecting the computer 1002 to an associated cloud storage system, the external storage interface 1026 can, with the aid of the adapter 1058 and/or modem 1060, manage storage provided by the cloud storage system as it would other types of external storage. For instance, the external storage interface 1026 can be configured to provide access to cloud storage sources as if those sources were physically connected to the computer 1002.

The computer 1002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather is to be construed in breadth, spirit and scope in accordance with the appended claims.

What is claimed is:

1. A system, comprising:
   a processor, and
   a memory that stores executable instructions that, when executed by the processor, facilitate performance of operations, the operations comprising:
      writing a redundant number of composite chunk copies comprising data fragments of a data chunk of stored data, to respective nodes of a node cluster, in which no identical data fragments are written to a common node;
      performing erasure coding on data of the stored data corresponding to the data chunk, to obtain coding fragments; and writing the coding fragments to respective storage devices of the node cluster, wherein the redundant number of the composite chunk copies corresponds to a level of protection selected to be provided to the stored data, and wherein the writing the coding fragments to the node cluster comprises:
   selecting the data fragments of one composite chunk copy as a main copy of the data fragments,
   determining a group of nodes that comprise greater than or equal to a minimum number of data fragments of the main copy, and
   storing respective ones of the coding fragments to respective nodes of the group of nodes.

2. The system of claim 1, wherein the minimum number of data fragments determined based on the number of the composite chunk copies, and wherein the writing the coding fragments to the respective storage devices of the node cluster comprises distributing the coding fragments to avoid having two coding fragments written to a same node.

3. The system of claim 1, wherein the operations further comprise deleting one less than the redundant number of composite chunk copies to leave a single composite chunk copy having the data fragments distributed among the nodes.

4. The system of claim 1, wherein the level of protection corresponds to a level of data mirroring.

5. The system of claim 1, wherein the minimum number of data fragments comprises a number of data fragments is fewer than the number of the composite chunk copies.

6. The system of claim 5, wherein the minimum number of data fragments corresponds to a number of data fragments that is one fewer than the number of the composite chunk copies.

7. The system of claim 1, wherein the operations further comprise processing the data chunk into a composite chunk comprising the data fragments.

8. The system of claim 1, wherein the operations further comprise allocating blocks on the nodes for the data fragments, and wherein the writing the redundant number of composite chunk copies comprises, selecting, for a data fragment, the redundant number of blocks allocated on different nodes as selected blocks for the data fragment, and storing a copy of the data fragment to the selected blocks.

9. The system of claim 1, wherein the operations further comprise persisting the data fragments and the coding fragments to non-volatile storage.

10. The system of claim 1, wherein the redundant number of the composite chunk copies equals three, and wherein the minimum number of data fragments corresponds to two data fragments.

11. The system of claim 1, wherein the node cluster comprises at least eight nodes.

12. A method, comprising:
   obtaining, by a system comprising a processor, data corresponding to a data chunk;
   writing a first number of composite chunk copies comprising the first number of copies of data fragments of the data to nodes of a node cluster, in which no identical data fragments are written to a common node;
   performing erasure coding on the data to obtain coding fragments and data fragments; and
   writing the coding fragments to the node cluster
      wherein the first number of the composite chunk copies corresponds to a level of protection selected to be provided to the stored data, and wherein the writing the coding fragments to the node cluster comprises:
      selecting the data fragments of one composite chunk copy as a main copy of the data fragments,
      based on the first number, determining a group of nodes that comprise greater than or equal to a second number of data fragments of the main copy, and
      storing respective ones of the coding fragments to respective nodes of the group of nodes.

13. The method of claim 12, wherein the writing the coding fragments to the storage devices of the node cluster can comprise distributing the coding fragments to avoid having two coding fragments maintained on a same node.

14. The method of claim 12, wherein the writing the first number of composite chunk copies comprises:
   allocating blocks on the nodes for the copies of the data fragments,
   selecting, for a selected data fragment, the first number of blocks allocated on different nodes as the first number of selected blocks for the data fragment, and
   storing the first number of copies of the selected data fragment to the three selected blocks.

15. The method of claim 12, wherein the second number corresponds to a minimum number of data fragments of the main copy.

16. The method of claim 12, further comprising persisting one of the composite copies and the coding fragments to non-volatile storage.

17. The method of claim 12, further comprising deleting all but a single composite chunk copy comprising the data fragments distributed among the nodes.

18. A non-transitory machine-readable medium, comprising executable instructions that, when executed by a processor, facilitate performance of operations, the operations comprising:
   processing data corresponding to a data chunk into data fragments;
   allocating, on nodes of a data storage system, a first number of storage blocks per data fragment corresponding to a degree of data mirroring to provide to data of the data storage system;
   selecting, per data fragment, the second number of selected storage blocks corresponding to the first number, and writing the second number of copies of the data fragment to the selected storage blocks;
   determining a main composite copy comprising a copy of the data fragments of the data chunk distributed across the nodes;
   processing data corresponding to the data chunk into coding fragments;
   determining a group of nodes for which the main composite copy does not have two data fragments maintained thereon; and
   writing the coding fragments to the group of nodes, in which respective coding fragments are written to respective nodes of the group of nodes, wherein the writing the coding fragments to the node cluster comprises:
      determining a group of nodes that comprise greater than or equal to a minimum number of data fragments of the copy of the data fragments, and
      storing respective ones of the coding fragments to respective nodes of the group of nodes.

19. The non-transitory machine-readable medium of claim 18, wherein the operations further comprise deleting a third number of composite chunk copies to leave a single composite chunk copy having the data fragments distributed among the nodes.

20. The non-transitory machine-readable medium of claim 18, wherein the operations further comprise persisting the main composite copy and the coding fragments, to non-volatile storage.

\* \* \* \* \*